United States Patent [19]

Shibata et al.

[11] 4,109,371
[45] Aug. 29, 1978

[54] PROCESS FOR PREPARING INSULATED GATE SEMICONDUCTOR

[75] Inventors: Hiroshi Shibata; Tsutomu Yoshihara, both of Itami, Japan

[73] Assignee: Mitsubishi Denki Kabushiki Kaisha, Tokyo, Japan

[21] Appl. No.: 755,943

[22] Filed: Dec. 30, 1976

[30] Foreign Application Priority Data

Jan. 6, 1976 [JP] Japan .................................. 51-983

[51] Int. Cl.² .................................. B01J 17/00
[52] U.S. Cl. .................................. 29/571
[58] Field of Search .................................. 29/571

[56] References Cited

U.S. PATENT DOCUMENTS

| | | | |
|---|---|---|---|
| 3,679,492 | 7/1972 | Fang et al. | 29/571 |
| 3,920,481 | 11/1975 | Hu | 29/571 |
| 4,033,026 | 7/1977 | Pashley | 29/571 |

*Primary Examiner*—Gerald A. Dost
*Attorney, Agent, or Firm*—Oblon, Fisher, Spivak, McClelland & Maier

[57] ABSTRACT

An insulated gate semiconductor is prepared by forming auxiliary regions for source-drain regions having a shallow junction by a self-aligning process using a gate electrode as a mask; covering it with a thick insulating membrane for surface protection; forming a contact hole for bonding an electrode in the thick insulating membrane; and forming source-drain regions having deep junction through the contact hole and bonding an electrode metal to it in the contact hole.

3 Claims, 4 Drawing Figures

PROCESS FOR PREPARING INSULATED GATE SEMICONDUCTOR

SUMMARY OF THE INVENTION

1. Field of the Invention

The present invention relates to a process for preparing a short channel type insulated gate semiconductor by a self-aligning process.

2. Description of the Prior Art

The typical insulated gate semiconductor is a field-effect transistor having M.I.S. (metal-insulator-semiconductor) structure. The process of the present invention will be illustrated on the silicon gate type field-effect transistor.

FIG. 1 is a sectional view of the conventional silicon gate type field-effect transistor 1 prepared by the known process.

In accordance with the known process, a thick insulating oxide membrane 3 is formed on a semiconductor substrate having the specific conductive type 2 by a local oxidation of silicon and then a silicon dioxide membrane 4 for gate is formed. A polycrystalline silicon or a metal having high melting point such as Mo and W is coated on the silicon dioxide membrane 4 by a chemical vapor deposition method, a vapor deposition method or sputtering method, and then a gate electrode 5 is formed by a photoetching. A source region 6 and a drain region 7 are formed by diffusing an impurity (conductive type is opposite to that of the semiconductor substrate 2) by the thermal diffusion method or ion implantation using the gate electrode 5 as a mask.

Then, a thick insulating oxide membrane 8 for surface protection is formed by the thermal oxidation method or the chemical vapor deposition method. An opening i.e. a contact hole 9 is formed by a photoetching, and a conductive material such as aluminum is bonded as an electrode metal 10.

Thus, in the known process to form the source-drain regions 6, 7 by diffusing the impurity under using the gate electrode as the mask, the impurity is diffused in the semiconductor substrate 2 to penetrate to transverse direction under the gate electrode 5 whereby the effective channel length is structurally shorter than the length of gate electrode 5 which is the apparent channel length given by the gate length. Accordingly, the fluctuation of characteristics of the products is caused in the mass production. It is difficult to control the transverse diffusion of impurity.

When a short channel type field-effect transistor having less than 5μ of a channel length is prepared, the short-channel effect is caused so that the breakdown voltage between the source and drain, is suddenly lowered and the difference of the threshold voltage ($V_{th}$) to the designed value is too much. Accordingly, it is difficult to prepare industrial products.

In order to overcome the short channel effect, there are two processes. One is to increase the concentration of impurity in the semiconductor substrate 2 under the gate electrode 5 so as to inhibit extending of the depletion layer from the side of the drain region 7 when the voltage is applied between the source and drain regions. The other process is to give a shallow junction between the source-drain regions 6, 7 so as to inhibit extending of the depletion layer.

However, when the concentration of impurity in the semiconductor substrate 2 under the gate electrode 5 is high, the threshold voltage ($V_{th}$) itself is high so as to deteriorate the characteristics of the field effect transistor. When the depth of the junction between the source-drain regions 6, 7 is 0.2 to 0.1μ or lower, the metal 10 such as aluminum can penetrate more than the depth of the junction of the source-drain regions 6, 7 to reach the semiconductor substrate 2 and current leakage is caused.

Accordingly, from the viewpoint of electrical characteristics and reliability, the process cannot be employed except considering the different step of forming the electrode, etc.

The silicon gate type field-effect transistor 1 having a sectional view shown in FIG. 2 which has not the above-mentioned disadvantage, has been proposed. In FIG. 2, like reference numerals designate identical or corresponding parts.

In the preparation of the silicon gate type field-effect transistor having the above-mentioned structure, the thick insulating oxide membrane 3 is formed on the desired conductive type semiconductor substrate 2 and then the silicon dioxide membrane 4 for the gate is formed on the surface, whereby the source-drain regions 6, 7 which have deep depth (conductive type is reverse to that of the semiconductor substrate 2) are formed in the semiconductor substrate 2 at the position separated enough from the part for forming the gate electrode.

In this case, the depth of the junction is deep so as to overcome the disadvantage caused in the formation of the electrode. The gate electrode 5 is formed by using the polycrystalline silicon etc., and then the ion (conductive type is the same as that of the source-drain regions 6, 7 is implanted in the narrow gap between the gate electrode 5 and the source-drain regions 6, 7 having a deep junction by using the gate electrode 5 as the mask, whereby the auxiliary regions 11, 12 are produced for the source-drain regions which have a shallow depth. Accordingly, the source-drain regions comprise a deep part and a shallow part. A thick insulating oxide membrane 8 for surface protection is formed and then the contact hole 9 is formed and the electrode metal 10 such as aluminum is bonded.

In accordance with the above-mentioned preparation, the channel length controlled by the self-aligning process is given whereby the short-channel can be attained. Moreover, the depth of the junction between the source-drain regions near the channel part is shallow whereby the characteristics of the field-effect transistor is improved.

However, in order to prevent a mask discrepancy caused depending upon the glass mask accuracy and the superposing accuracy in the preparation, the source-drain regions 6, 7 having a deep junction should be formed at the part separated enough from the gate electrode 5. When the electrode metal 10 and the contact hole 9 are formed, the contact hole 9 should be included in the source-drain regions 6, 7 having a deep junction.

In accordance with the above-mentioned process, the short channel can be attained, however, it has been difficult to form a desired fine pattern because of limitation of the mask superposing accuracy and the pattern size accuracy.

SUMMARY OF THE INVENTION

It is an object of the present invention to provide a process for easily preparing an insulated gate semiconductor having short channel structure and fine pattern and excellent characteristics in high reproducibility without the above-mentioned disadvantages.

The object of the present invention is to provide a process for preparing an insulated gate semiconductor which comprises forming an auxiliary region for the source-drain regions having a shallow junction by a self-aligning process using a gate electrode as a mask; covering it with a thick insulating membrane for surface protection; forming a contact hole for bonding an electrode in the thick insulating membrane; forming source-drain regions having a deep junction through the contact hole and bonding an electrode metal to it in the contact hole.

Accordingly, in the preparation of the insulated gate semiconductor of the invention, the diffusion for forming the deep source-drain regions is attained through the contact hole for bonding the electrode metal whereby the masking is attained with the same mask so as to prevent the discrepancy of the mask superposition and it is unnecessary to consider the size allowance for the masking accuracy between the source-drain regions and the contact hole for bonding the electrode. Accordingly, the fine pattern can be formed and an integrated circuit having high degree of integration can be easily prepared.

The junction depth of the source-drain regions is controlled as desired through the contact hole for bonding the electrode metal. Accordingly, when the electrode metal is bonded in the later step, the electrode metal does not substantially penetrate into the substrate regions. The current leaked to the semiconductor substrate can be substantially prevented. Thus, the short circuit between the electrode metal and the semiconductor substrate can be prevented because of no discrepancy in the masking. Accordingly, the insulated gate semiconductor having excellent characteristics and high reliability can be obtained.

DESCRIPTION OF THE PREFERRED EMBODIMENTS

One embodiment of the process of the present invention will be illustrated in order of sequential steps.

Figure 1:
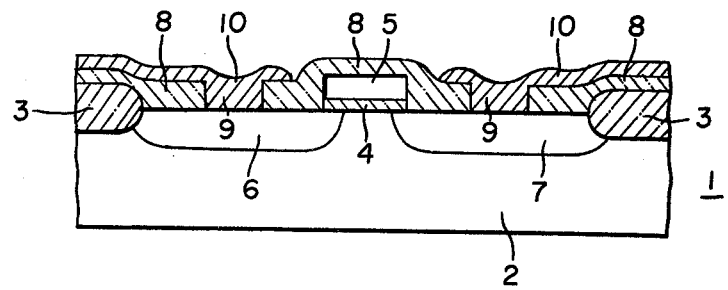
FIG. 1 is a sectional view of the conventional silicon gate type M.I.S. field-effect semiconductor prepared according to the known process.
Figure 2:
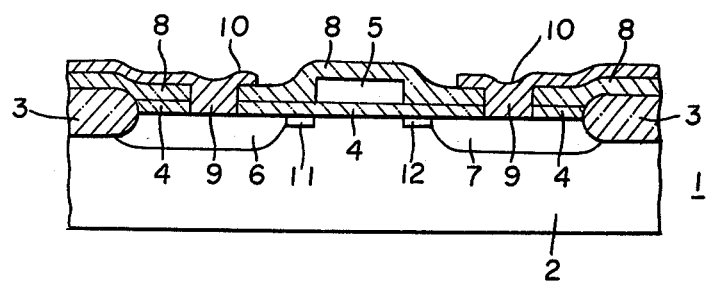
FIG. 2 is a sectional view of the conventional silicon gate type M.I.S. field-effect transistor prepared according to the other known process.
Figure 3:
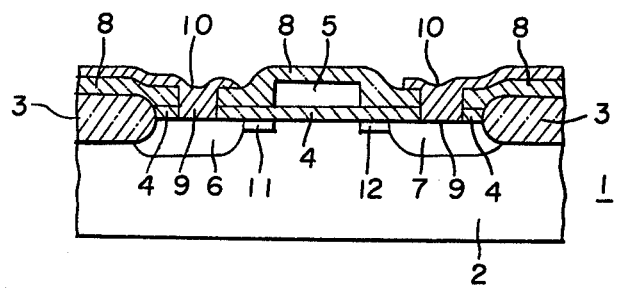
FIG. 3 is a sectional view of one embodiment of the insulated gate semiconductor prepared according to the process of the invention.
Figure 4:
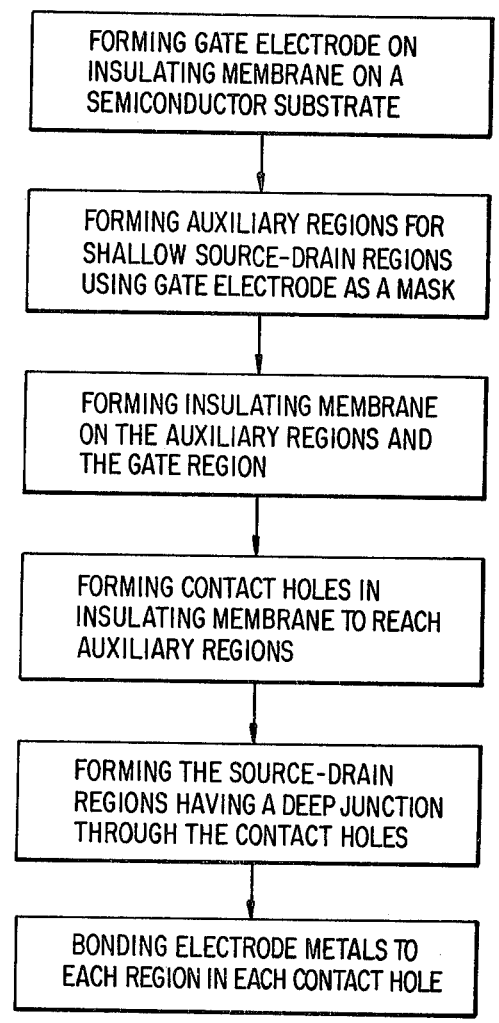
FIG. 4 is a block diagram of the steps in the process of preparing the embodiment of the insulated gate semiconductor illustrated in FIG. 3 in accordance with the invention.

FIG. 3 shows the silicon gate type field-effect transistor 1 prepared according to the process of the invention. In FIG. 3, like reference numerals designate identical or corresponding parts in FIG. 1.

The thick insulating oxide membrane 3 is formed on the desired conductive type semiconductor substrate, and then a gate insulating membrane such as a silicon dioxide membrane 4 for a gate is formed. The polycrystalline silicon or the metal having high melting point such as Mo, W is coated on the entire surface of the silicon dioxide 4 by the chemical vapor deposition method, the vapor deposition method or the sputtering method and the resulting coated layer is removed except the part of the gate electrode 5 by the photoetching to form the gate electrode 5.

The auxiliary regions 11, 12 for the source-drain regions having shallow junction are formed by the self-aligning process such as the ion implantation for implanting the impurity (conductive type is opposite to that of the semiconductor substrate 2) into the semiconductor substrate 2 with the mask of the gate electrode 5. When the ion injection method is applied for forming the source-drain region having shallow junction, the ion accelerating energy is predetermined for the optimum form. In order to prevent the effect by the heat treatment in the later step, it is preferable to select ions having small diffusion coefficient such as As, Sb ions in the case of the N channel type M.I.S. field-effect transistor.

In order to protect the surface exposing the auxiliary regions 11, 12 and the gate electrode 5, the thick insulating oxide membrane 8 is formed by the thermal oxidization method or the chemical vapor deposition method. The contact hole 9 required for the later step is formed by the photoetching in the thick insulating oxide membrane 8 so as to reach to the auxiliary regions 11, 12. Then, the source region 6 and the drain region 7 which have each deep junction are formed by diffusing or ion implantation (conductive type is the same with that of the auxiliary regions 11, 12 for the source-drain regions having shallow junction) through the contact hole 9 by the diffusion method or the ion injection method.

The source-drain regions 6, 7 having deep junction are preferably to have a high enough concentration of the impurity at the surface so as to be brought into low resistant contact when the electrode metal 10 is bonded in the later step.

In the above-mentioned steps, the source region is formed by the deep region 6 and the shallow region 11 and the drain region is formed by the deep region 7 and the shallow region 12.

Then, the electrode metal 10 having conductivity such as aluminum is bonded through the contact hole 9 to the regions or the chemical vapor deposition method and the needless parts are removed by photoetching to prepare the silicon gate type field-effect transistor.

In the embodiment, the silicon gate type field-effect transistor has been illustrated. Thus, the process of the invention can be applied for all of insulated gate semiconductor as understood.

What is claimed is:

1. A process for preparing an insulated gate semiconductor which comprises the steps of:
   forming a gate electrode on an insulating membrane on a semiconductor substrate;
   forming auxiliary regions for shallow source-drain regions having conductive type being opposite to that of said semiconductor substrate in said semiconductor substrate by using said gate electrode as a mask so that the edges of the shallow source-drain regions are self-aligned with the edges of the gate electrode;
   forming an insulating membrane for surface protection on said auxiliary regions and said gate region;
   forming contact holes in said insulating membrane to reach to said auxiliary regions at positions separated by a desired distance from said gate electrode;
   forming source-drain regions having deep junctions in said semiconductor substrate through said contact holes so that the edges of the deep source-drain regions are displaced from the edges of the gate electrode and the contact holes, whereby the source-drain regions comprise a deep part and a shallow part; and bonding electrode metals to each region in each contact hole.

2. A process for preparing an insulated gate semiconductor according to claim 1, wherein said auxiliary regions for said shallow source-drain regions are formed by an ion implantation method.

3. A process for preparing an insulated gate semiconductor according to claim 1, wherein said deep source-drain regions are formed by a diffusion method or an ion injection method.

* * * * *